(12) United States Patent
Shen

(10) Patent No.: US 8,490,680 B2
(45) Date of Patent: Jul. 23, 2013

(54) PLATE COOLING FIN WITH SLOTTED PROJECTIONS

(75) Inventor: Ching-Hang Shen, New Taipei (TW)

(73) Assignee: Asia Vital Components Co., Ltd, New Taipei (TW)

( * ) Notice: Subject to any disclaimer, the term of this patent is extended or adjusted under 35 U.S.C. 154(b) by 0 days.

(21) Appl. No.: 13/269,712

(22) Filed: Oct. 10, 2011

(65) Prior Publication Data

US 2012/0024514 A1 Feb. 2, 2012

Related U.S. Application Data

(63) Continuation-in-part of application No. 12/039,269, filed on Feb. 28, 2008, now abandoned.

(51) Int. Cl.
*F28F 7/00* (2006.01)

(52) U.S. Cl.
USPC ....... 165/80.3; 165/181; 165/182; 165/109.1; 361/704

(58) Field of Classification Search
USPC ....... 165/80.3, 182.185, 181, 109.1; 361/700, 361/704; 415/175–178
See application file for complete search history.

(56) References Cited

U.S. PATENT DOCUMENTS

| 1,788,516 A * | 1/1931 | Gannon | 165/182 |
| 3,670,215 A * | 6/1972 | Wilkens et al. | 257/718 |
| 5,351,166 A * | 9/1994 | Kang | 361/690 |
| 5,611,395 A * | 3/1997 | Kang et al. | 165/151 |
| 5,667,006 A * | 9/1997 | Kang et al. | 165/151 |
| 5,738,168 A * | 4/1998 | Patel et al. | 165/151 |
| 6,364,009 B1 * | 4/2002 | MacManus et al. | 165/185 |
| 2005/0190538 A1 * | 9/2005 | Huang | 361/697 |
| 2007/0131406 A1 * | 6/2007 | Tsai | 165/185 |
| 2008/0017349 A1 * | 1/2008 | Li et al. | 165/80.3 |

* cited by examiner

*Primary Examiner* — Brandon M Rosati
*Assistant Examiner* — Orlando E Aviles Bosques

(57) ABSTRACT

A plate cooling fin includes a plate member and projection parts disposed on the plate member. Each of the projection parts has rectangular slots disposed at the periphery thereof with a partition is disposed between adjacent rectangular slots respectively. Therefore, the cold airflow is guided to pass through the slots and turned into a turbulent flow surrounding the plate member so as to extend the stagnation time of the airflow at the plate member for a large amount of heat being carried outward the cooling fin to enhance the heat dissipation efficiency.

2 Claims, 4 Drawing Sheets

PLATE COOLING FIN WITH SLOTTED PROJECTIONS

The present application is a continuation in part of application Ser. No. 12/039,269 filed on Feb. 28, 2008.

BACKGROUND OF THE INVENTION

1. Field of the Invention

The present invention is related to a cooling fin and particularly to a plate cooling fin with slotted projections capable of enhancing heat dissipation efficiency.

2. Brief Description of the Related Art

The processing speed of the electronic chip increases due to incessantly progress of technology but it leads to increase of the generated heat as well. Nevertheless, the high temperature is a primary reason of the undesirable operation efficiency and burn-out of the chip. Therefore, how to dissipate the heat from the chip for protecting the chip is one of the subjects that are researched and developed currently.

In order to obtain the best effect of heat dissipation and promote the heat dissipation efficiency, most researches and developments are focused on the increased conductive area for the heat transmitted by the heat sink and the fan mounted to the heat sink for forcing the airflow. Besides, a plurality of cooling fins being stacked as a cooling fin set in association with guide heat pipes is utilized to promote the heat dissipation efficiency. The respective cooling fin has a flat plate member with two opposite bent edges for engaging with each other. When the fan induces the air to pass through the cooling fin set, the airflow moves fast and it is able to carry a small amount of heat on the cooing fin set only. Hence, the effect of heat dissipation is still limited although it was designed for expecting the good heat transfer with the effective heat dissipation.

SUMMARY OF THE INVENTION

In order to overcome the deficiencies of the prior art, an object of the present invention is to provide a plate cooling fin with slotted projections which brings into the concept of turbulent flow for increasing the stagnation time of the air staying at the cooling fin and enhancing the efficiency of heat dissipation in addition to increase the area of the heat dissipation.

Accordingly, the cooling fin according to the present invention comprises a plurality of projection parts and a plurality of slots which are disposed at the periphery of each of the projection parts for turning the outside cold airflow into the turbulent flow with eddy currents at the periphery of the cooling fin while the air flow passing through the slots. Therefore, the airflow can stagnate at the cooling fin longer time for carrying more heat outward and enhancing the heat dissipation efficiency.

Wherein, the respective projection part is four-side shape or truncated cone shape. Further, the projection parts can be arranged irregularly on the plate member such that the effect of different eddy currents at the periphery of the cooling fin can be produced advantageously and the slots at the lateral sides of the respective projection part are helpful for increasing the coefficient of heat exchange of the cooling fin and enhancing the integral performance of the cooling fin.

BRIEF DESCRIPTION OF THE DRAWINGS

The detail structure, the applied principle, the function and the effectiveness of the present invention can be more fully understood with reference to the following description and accompanying drawings, in which.

DETAILED DESCRIPTION OF THE INVENTION

Figure 1:
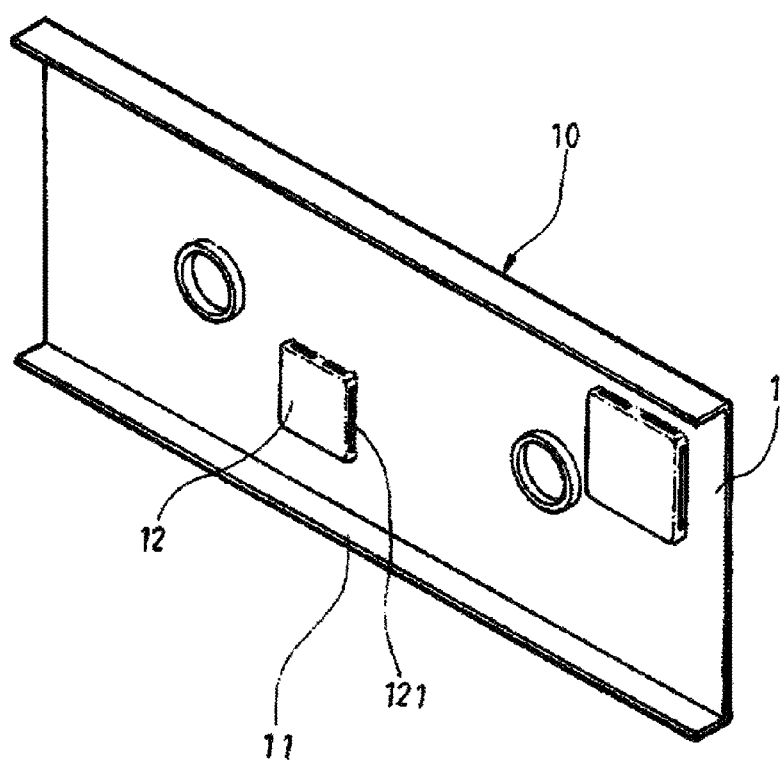
FIG. 1 is a perspective view of a plate cooling fin with slotted projections according to a preferred embodiment of the present invention.
Figure 2:
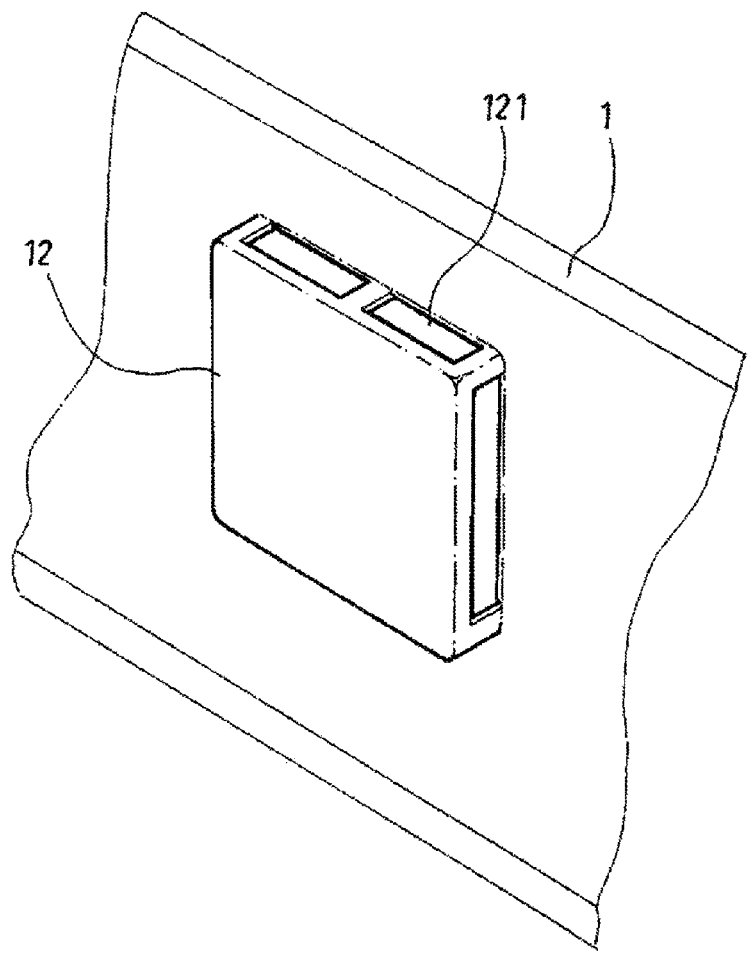
FIG. 2 is a fragmentary perspective view of the cooling fin shown in FIG. 1 illustrating the four-side shaped protrusion part.

Referring to FIGS. 1 and 2, the cooling fin 10 according to the first preferred embodiment of the present invention basically is a plate member 1 with a bent edge 11 at two opposite lateral sides. The bent edge 11 can be provided with an engaging part for joining two adjacent plate members 1. A plurality of projection parts 12 are provided on the plate member 1, and the respective projection part 12 is four-side shape such as square shape with a plurality of rectangular slots 121 being disposed at the periphery thereof. It can be seen in FIG. 2 that the slots 121 space apart from each other with a partition disposed between the slots 121 respectively for guiding the airflow to pass through the plate member 1, and turning the airflow into a turbulent flow with eddy currents to surround the plate member 1. In this way, the stagnation time of the airflow at the plate member 1 can be extended such that more heat can be carried outward the cooling fin for enhancing heat dissipation.

Besides, the projection parts 12 can be arranged irregularly at the cooling fin 10 such that the effect resulting from different eddy currents at the periphery of the cooling fin and the slots 121 at the lateral sides of the respective projection part 12 can promote the coefficient of heat exchange of the cooling fin 10 to enhance the integral performance of the cooling fin 10.

Figure 3:
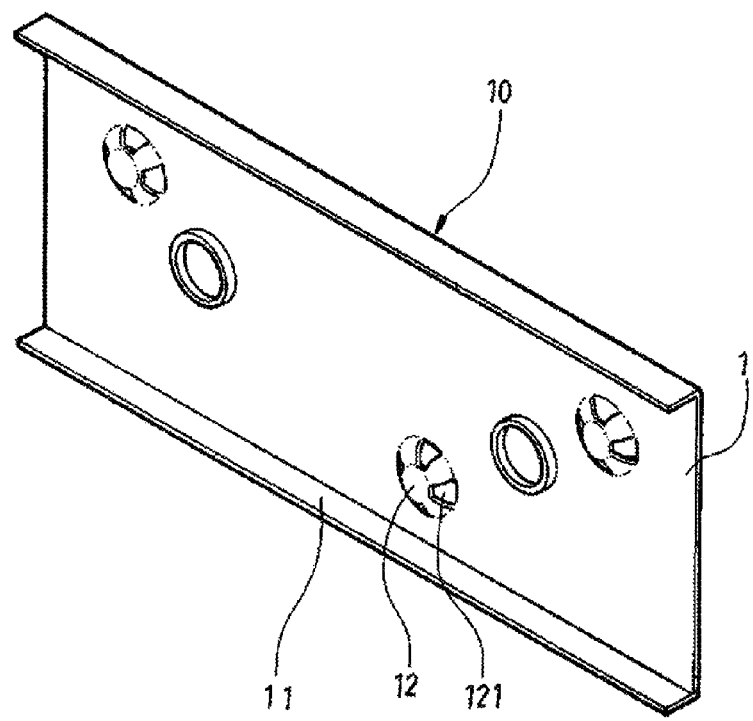
FIG. 3 is a perspective view of a cooling fin according to another embodiment of the present invention.
Figure 4:
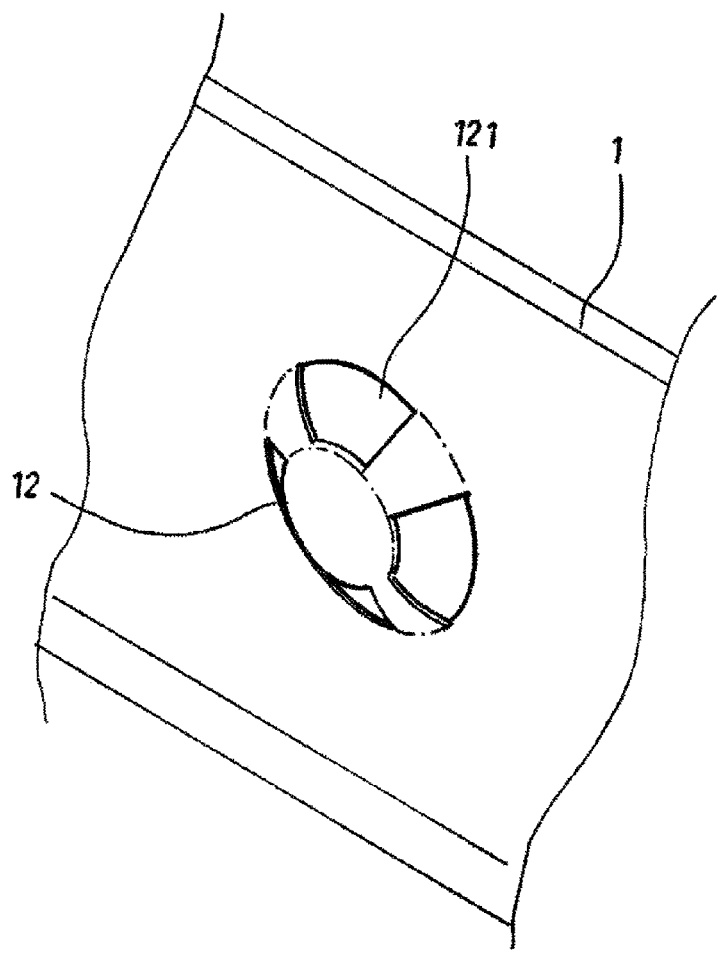
FIG. 4 is a fragmentary perspective view of the cooling fin shown in FIG. 3 illustrating the truncated cone shaped protrusion part.

Referring to FIGS. 3 and 4, another embodiment of a plate cooling fin with slotted projections according to the present invention is illustrated. Similarly, the cooling fin 10 of the second embodiment basically is a plate member 1 with a bent edge 11 at two opposite lateral sides thereof. The bent edge 11 can be provided with an engaging part for joining two adjacent plate members 1. A plurality of projection parts 12 are provided on the plate member 1, and each of the projection parts 12 is truncated cone shape with an inclined periphery, and a plurality of trapezoid slots 121 are disposed at the periphery and space apart from each other with a partition disposed between the slots 121 respectively for guiding the airflow to pass through the plate member 1 and inducing the airflow to turn into the turbulent flow to surround the plate member 1. It can be seen in FIG. 4 that the slots 121 space apart from each other. The difference of the second embodiment from the first embodiment shown in FIGS. 1 and 2 is in that the shape of the respective projection part 12 is truncated cone shaped profile instead of four-side shape. In this way, the stagnation time of the airflow at the plate member 1 can be extended, and more heat can be carried outward from the cooling fin for enhancing heat dissipation as well.

While the invention has been described with referencing to the preferred embodiments thereof, it is to be understood that modifications or variations may be easily made without departing from the spirit of this invention, which is defined by the appended claims.

What is claimed is:

1. A plate cooling fin comprising:

a plate member with a bent edge at two opposite sides thereof respectively;

a plurality of projection parts being disposed at said plate member;

wherein the respective projection part has a four-side shaped periphery, a plurality of rectangular slots disposed at the periphery with a partition disposed between the slots respectively; said plurality of rectangular slots and said partition disposed between said plurality of slots, respectively, are located at the same side of said four-side shaped projection part periphery;

wherein the slots guide an airflow to pass through the slots and turn the airflow into a turbulent flow surrounding the plate member so as to extend stagnation time of the airflow at the plate member such that a large amount of heat is carried outward the cooling fin for enhancing heat dissipation efficiency.

2. The plate cooling fin as defined in claim 1, wherein each of said projection parts is square shape.

* * * * *